Figure 1:
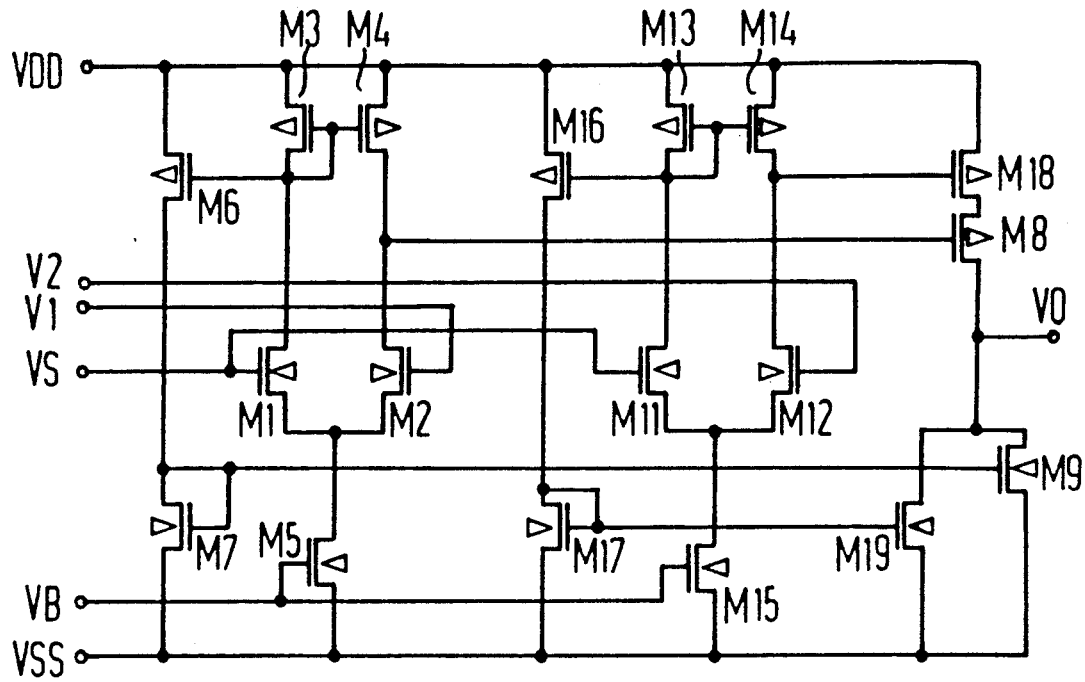

United States Patent [19]

Zitta

[11] Patent Number: 5,049,761
[45] Date of Patent: Sep. 17, 1991

[54] CMOS PULSE WIDTH MODULATOR

[75] Inventor: Heinz Zitta, Drobollach, Austria

[73] Assignee: Siemens Aktiengesellschaft, Munich, Fed. Rep. of Germany

[21] Appl. No.: 412,916

[22] Filed: Sep. 26, 1989

[30] Foreign Application Priority Data

Sep. 26, 1988 [EP] European Pat. Off. ............ 88115840

[51] Int. Cl.$^5$ .......................... H03K 5/04; H03K 5/24
[52] U.S. Cl. .................................... 307/360; 307/265; 307/494
[58] Field of Search ................ 307/350, 360, 265, 494

[56] References Cited

U.S. PATENT DOCUMENTS

| 3,818,249 | 6/1974 | Teranishi et al. | 307/265 |
| 4,238,695 | 12/1980 | Hock | 307/350 |
| 4,549,151 | 10/1985 | Kaneko | 307/265 |

FOREIGN PATENT DOCUMENTS

| 3227296 | 2/1983 | Fed. Rep. of Germany |  |
| 0122020 | 7/1984 | Japan | 307/360 |

OTHER PUBLICATIONS

U.S. Publication Electronic Design, vol. 30 (1982), Jul. 8, 1982, No. 14, Waseca, MN, Deuville, N.J., Article "Scaling Down PWM Chip Suits Low-Power Switches", by J. Albernack et al., p. 175, FIG. 1.
U.S. Publication IEEE Journal of Solid State Circuits, vol. SC-17, No. 6, Dec. 1982, New York, Article "MOS Operational Amplifier Design-A Tutorial Overview", by Paul R. Gray et al., pp. 969-981.
German Democratic Republic, Publication Radio, Fernsehen Elektronik, 27th Year, No. 9 (1978-09) Berlin, Article "Schaltungsbeispiele mit CMOS-Schaltkreisen", by G. Turinsky, pp. 551-555, VEB Verlag Technik, Berlin, p. 552, Left Column, Last Paragraph--Right Column, 2nd Paragr., FIG. 5.
U.S. Publication AMK Berlin Congress and Convention Division, ICC Berlin Continuing Engineering Education Program, Seminar 713, Jun. 9-12, 1986, Prel. Edition of "CMOS Analog IC Design and CAD Techniques", by Ph. E. Allen, GA Inst. of Technology, pp. 352-356.

Primary Examiner—John Zazworsky
Attorney, Agent, or Firm—Herbert L. Lerner; Laurence A. Greenberg

[57] ABSTRACT

A pulse width modulator configuration in complementary MOS circuit technology includes two comparators for comparing an input signal with two reference signals and producing results of the comparison. Output stages are associated with the comparators. The output stages are interconnected for logically linking the results of the comparison.

3 Claims, 1 Drawing Sheet

CMOS PULSE WIDTH MODULATOR

The invention relates to a pulse width modulator configuration in complementary MOS circuit technology, in which two comparators with associated output stages compare an input signal with two reference signals, and in which the results of the comparison are logically linked.

Pulse width modulators perform the tasks of comparing a voltage of an oscillator with two different voltages, and of logically linking the results of the comparison to one another. Pulse width modulators are often used in power packs, especially in switching power packs.

It is known to make a pulse width modulator from two comparators with a logic circuit connected to the output side. For example, a sawtooth voltage of an oscillator may be compared with the first comparison voltage in one comparator and with the second comparison voltage in the other comparator. The outputs of the comparators form the inputs of a logical AND gate, having an output which is the output of the pulse width modulator. The output of the logic element is active only when the first comparison voltage is greater than the sawtooth voltage and at the same time the second comparison voltage is likewise greater than the sawtooth voltage. However, in seeking to attain increasingly large-scale integration and shorter switching times in integrated circuits, the disadvantage of such a circuit is that it requires a relatively large surface area, and carries with it other problems, not the least of which is long switching times.

It is accordingly an object of the invention to provide a CMOS pulse width modulator, which overcomes the hereinafore-mentioned disadvantages of the heretofore-known devices of this general type and which has a plurality of inputs, which is an improvement over the previously known versions.

With the foregoing and other objects in view there is provided, in accordance with the invention, a pulse width modulator configuration in complementary MOS circuit technology, comprising two comparators for comparing an input signal with two reference signals and producing results of the comparison, and output stages associated with the comparators, the output stages being interconnected for logically linking the results of the comparison.

An advantage of the invention is that because it is made by complementary MOS circuit technology, the logic linking element which is required can be included in the circuit of the comparators. This means that no additional transistors are needed, that the surface area required by the circuit is small and that the switching times become shorter.

In accordance with another feature of the invention, the comparators have outputs, and the output stages include first output transistors being controlled by the comparator outputs and second output transistors being complementary to the first output transistors, the first output transistors of the two comparators having output circuits connected in series, and second output transistors of the two comparators having output circuits connected in parallel.

In accordance with a concomitant feature of the invention, the second output transistors are combined into one transistor.

Other features which are considered as characteristic for the invention are set forth in the appended claims.

Although the invention is illustrated and described herein as embodied in a CMOS pulse width modulator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single figure of the drawing.

Figure 2:
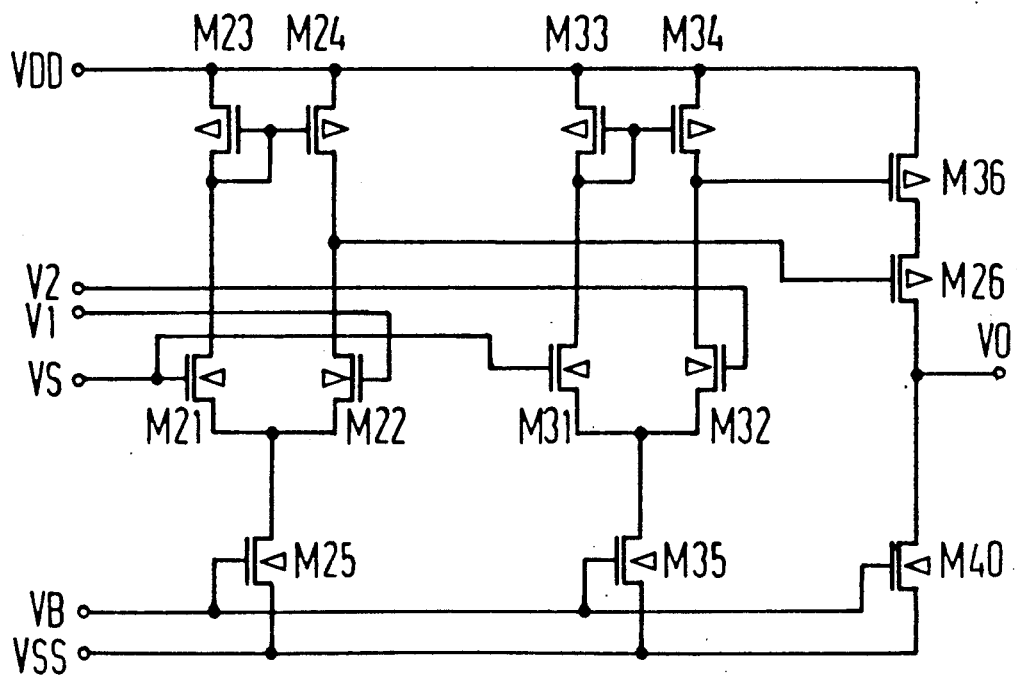

FIG. 1 is a schematic circuit diagram of a comparator with integrated logical linkage of output signals; and FIG. 2 is a view similar to FIG. 1 of another embodiment of a comparator with integrated logical linkage of output signals.

Referring now in detail to the figures of the drawings in which identical elements are provided with the same reference numerals and first, particularly, to FIG. 1 thereof, there is seen an exemplary embodiment which is based on a CMOS comparator such as is known from the publication ICC Berlin Continuing Engineering Education Program, June 1986, pp. 7.4.1-7.4.5. A first comparator circuit M1-M5 of this kind includes a differential input stage being formed of input transistors M1 and M2, which are supplied by a current source M5 at a common source terminal and each of which drive a respective load transistor M3 and M4. The control connections of the load transistors are connected to one another and to the drain connection of the transistor M3. The current source M5 is in the form of a transistor having a control connection which is controlled by a bias voltage through a terminal VB. An output driver circuit M6-M9 which is connected to the output side of the first comparator, is formed of a reference stage having reference transistors M6 and M7 and an output stage having an output transistor M8 and an output complementary transistor M9. The first comparator circuit configuration is supplied by a supply voltage source through terminals VDD and VSS. The reference transistor M6 is controlled by a connection point between the output circuits of the transistors M1 and M3. The transistor M7 is connected as a diode and forms a current mirror in combination with the transistor M9. The output transistor M8 is controlled by the output of the first comparator at a connection point between the output circuits of the transistors M2 and M4.

A second comparator corresponds in layout to the first and includes comparator transistors M11-M15 and transistors M16-M19 of a second output driver circuit. A second output driver circuit includes reference transistors M 16 and M 17 as well as an output transistor M18 and an output complementary transistor M19. The wiring of the transistors M11-M19 is provided like the wiring of the transistors M1-M9.

An oscillator voltage to be applied to the comparators is supplied through a terminal VS to the control connections of the transistors M1 and M11. Two comparison voltages are supplied on one hand through a terminal V1 to the control connection of the transistor M2 and on the other hand through a terminal V2 to the control connection of the transistor M12.

According to the invention, the output stages of the two comparators are interconnected in order to make a logical AND linkage. To this end, the output circuits of the output transistors M8 and M18 are connected in series, and the output complementary transistors M9 and M19 are connected in parallel. An output terminal V0 of the pulse width modulator is located at a connecting point between the output circuits of the series circuit and of the parallel circuit of the output stage. The logical linkage is provided due to the fact that the output terminal V0 cannot be applied to a logical 1 potential until the output of the first comparator has made the transistor M8 conducting and the output of the second comparator has also made the transistor M18 conducting. Otherwise, the output terminal V0 is at a logical 0 potential if only one of the output complementary transistors M9 or M19 is triggered. The circuit configuration according to the invention requires the same number of transistors as two CMOS differential comparators.

The exemplary embodiment shown in FIG. 2 is based on a CMOS comparator circuit such as is known from the publication IEEE ISSC, Vol. Sc-17, No. 6, December 1982, pp. 969-982. In this case, the comparators are in the form of transistors M21-M25 and M31-M35, comparable to the first exemplary embodiment of FIG. 1. However, only one output stage is provided as the output driver circuit, which provides one respective output transistor M26 and M36 for each comparator and one output complementary transistor. While the output transistors are controlled by the respective associated outputs of the comparator, the output complementary transistors are controlled through the terminal VB by the bias voltage, like the current source transistors.

In the exemplary embodiment of FIG. 2, the two output complementary transistors are replaced by a single output complementary transistor M40. Otherwise, the same description applies for the logical linkage of the output signals of the comparators as for the exemplary embodiment of FIG. 1. Thus the output circuits of the transistors M26 and M36 are connected in series, while the output complementary transistors are connected in parallel, if two transistors are provided. The output connection having the terminal V0 is located at a connecting point between the series circuit of the output transistors and the output complementary transistor or transistors. Again, this exemplary embodiment either needs only the same number of transistors as two individual CMOS comparators, or even a smaller number of transistors than two individual CMOS comparators.

I claim:

1. Pulse width modulator configuration in complementary MOS circuit technology, comprising two comparators for comparing an input signal with two reference signals and producing results of the comparison, and output stages associated with said comparators, said output stages being interconnected for logically linking the results of the comparison, wherein said comparators have outputs, and said output stages include first output transistors being controlled by said comparator outputs and second output transistors being complementary to said first output transistors, said first output transistors having output circuits connected in series, and said second output transistors of said two comparators having output circuits connected in parallel.

2. Configuration according to claim 1, wherein said second output transistors are combined into one transistor.

3. Pulse width modulator configuration in complementary MOS circuit technology, comprising two comparators for comparing an input signal with two reference signals and producing results of the comparison, and output stages associated with said comparators, said output stages being interconnected for logically linking the results of the comparison, wherein said comparators have outputs, and said output stages included first output transistors being controlled by said comparator outputs and a second common output transistor being complementary to said first output transistors, said first output transistors having output circuits connected in series.

* * * * *